(12) United States Patent
Maki

(10) Patent No.: US 10,168,434 B2
(45) Date of Patent: Jan. 1, 2019

(54) REFERENCE SIGNAL GENERATION DEVICE, ELECTRONIC DEVICE, MOVING OBJECT, DATA COMMUNICATION DEVICE, AND TERRESTRIAL DIGITAL COMMUNICATION NETWORK

(71) Applicant: Seiko Epson Corporation, Tokyo (JP)

(72) Inventor: Yoshiyuki Maki, Suwa (JP)

(73) Assignee: Seiko Epson Corporation (JP)

( * ) Notice: Subject to any disclaimer, the term of this patent is extended or adjusted under 35 U.S.C. 154(b) by 256 days.

(21) Appl. No.: 15/161,735

(22) Filed: May 23, 2016

(65) Prior Publication Data

US 2016/0349374 A1 Dec. 1, 2016

(30) Foreign Application Priority Data

May 29, 2015 (JP) .................................. 2015-109532

(51) Int. Cl.
*G01S 19/36* (2010.01)
*H03L 7/26* (2006.01)
(Continued)

(52) U.S. Cl.
CPC ................ *G01S 19/36* (2013.01); *H03L 7/26* (2013.01); *G01S 11/02* (2013.01); *G01S 17/10* (2013.01)

(58) Field of Classification Search
CPC ... H04L 7/033; H04L 7/04; H04L 2027/0067; H04L 27/2657; H04L 27/0014; H04L 27/06; H04L 7/0337; H04L 7/0012; H03L 7/0807; H03L 7/00; H03L 7/0814; H03L 7/087; H03L 7/06; H03L 7/18;
(Continued)

(56) References Cited

U.S. PATENT DOCUMENTS 4,899,117 A * 2/1990 Vig ........................... G04G 7/00
331/176
9,584,142 B2 * 2/2017 Ueno ..................... H03L 7/1976
(Continued)

FOREIGN PATENT DOCUMENTS

JP EP 0351780 A2 * 1/1990 ............... H03L 7/26
JP 07-022945 A 1/1995
(Continued)

*Primary Examiner* — Olumide Ajibade Akonai
(74) *Attorney, Agent, or Firm* — Harness, Dickey & Pierce, P.L.C.

(57) ABSTRACT

A reference signal generation device includes a reception unit that receives a reference signal, a first oscillator that includes an atomic oscillator, a first phase comparator that compares a signal output from the first oscillator and the reference signal in phase, a second oscillator that generates a signal to be output outwardly, and a second phase comparator that compares the signal output from the first oscillator and a signal output from the second oscillator in phase. The first oscillator includes a sweeping-result output unit that outputs a sweeping result signal corresponding to a resonance signal obtained by performing frequency sweeping in the first oscillator. The reference signal generation device further includes a determination section that determines a failure state based on the sweeping result signal and at least one of a phase comparison signal of the first phase comparator and a phase comparison signal of the second phase comparator.

9 Claims, 8 Drawing Sheets

(51) Int. Cl.
*G01S 11/02* (2010.01)
*G01S 17/10* (2006.01)

(58) Field of Classification Search
CPC ......... H03L 7/26; H03L 7/099; H04B 1/7073;
G01S 19/36; G01S 19/20; G01S 19/24;
G01S 19/37; G01S 19/13; G01S 19/01;
G01S 17/10; G01S 11/02; H04J 3/0644;
H04J 3/0688
USPC ............. 331/3, 94.1; 375/357, 362, 373
See application file for complete search history.

(56) References Cited

U.S. PATENT DOCUMENTS

| | | | |
|---|---|---|---|
| 2002/0125959 A1* | 9/2002 | Atsumi | ............ H03L 7/26 331/3 |
| 2006/0202771 A1* | 9/2006 | Seki | ............ G04C 13/00 331/158 |
| 2013/0300510 A1* | 11/2013 | Tamura | ............ H03L 1/02 331/69 |

FOREIGN PATENT DOCUMENTS

| | | | |
|---|---|---|---|
| JP | 2010-232792 A | 10/2010 | |
| JP | 2011-155367 A | 8/2011 | |

\* cited by examiner

| ABRASION FAILURE LEVEL FLUCTUATION RATE A (NORMALITY/ABNORMALITY) | PHASE DIFFERENCE IN PHASE COMPARATOR 21 (NORMALITY/ABNORMALITY) | PHASE DIFFERENCE IN PHASE COMPARATOR 26 (NORMALITY/ABNORMALITY) | STATUS |
| --- | --- | --- | --- |
| ABNORMALITY | NORMALITY | NORMALITY | ABRASION FAILURE MODE |
| ABNORMALITY | ABNORMALITY | NORMALITY | RECEPTION FAULT OF A SATELLITE SIGNAL |
| ABNORMALITY | NORMALITY | ABNORMALITY | FAILURE |
| ABNORMALITY | ABNORMALITY | ABNORMALITY | FAILURE |
| NORMALITY | ABNORMALITY | ABNORMALITY | FAILURE IN COMPONENTS OTHER THAN ATOMIC OSCILLATOR |
| NORMALITY | NORMALITY | NORMALITY | NORMALITY |

FIG. 5

| ABRASION FAILURE LEVEL FLUCTUATION RATE A (%) | STATUS |
|---|---|
| 1 | COMPLETE FAILURE WITHIN ABOUT THREE MONTHS |
| 5 | COMPLETE FAILURE WITHIN ABOUT ONE MONTH |
| 10 | COMPLETE FAILURE WITHIN ABOUT ONE WEEK |
| 20 | COMPLETE FAILURE WITHIN ABOUT ONE DAY |

FIG. 6

REFERENCE SIGNAL GENERATION DEVICE, ELECTRONIC DEVICE, MOVING OBJECT, DATA COMMUNICATION DEVICE, AND TERRESTRIAL DIGITAL COMMUNICATION NETWORK

CROSS REFERENCE

This application claims the benefit of Japanese Application No. 2015-109532, filed on May 29, 2015. The disclosure of the prior application is hereby incorporated by reference herein in its entirety.

BACKGROUND

1. Technical Field

The present invention relates to a reference signal generation device, an electronic device, a moving object, a data communication device, and a terrestrial digital communication network.

2. Related Art

A global positioning system (GPS) which is one of global navigation satellite systems (GNSS) using a satellite has been widely known. An atomic clock having significantly high precision is mounted in a GPS satellite used in the GPS. A satellite signal on which orbit information, accurate time information, or the like of a GPS satellite is superimposed is transmitted to the ground. The satellite signal transmitted from the GPS satellite is received by a GPS receiver. The GPS receiver performs processing of calculating the current position or the current time information of the GPS receiver, processing of generating an accurate timing signal (1 PPS) synchronized with the coordinated universal time (UTC), or the like based on the orbit information or the time information superimposed on the satellite signal.

As such a GPS receiver, a GPS receiver in which a normal positioning (position estimation) mode in which a position and time are provided, and a position fixed mode in which time is provided through fixed location positioning at a known position, are provided based on positioning calculation is generally used.

In the normal positioning mode, satellite signals from the predetermined number or more (three is the minimum if being used for two-dimensional positioning, and four is minimum if being used for three-dimensional positioning) of GPS satellites are required. As the number of GPS satellites which enable reception of the satellite signal is increased, the accuracy of the positioning calculation becomes more improved.

In the position fixed mode, if position information of the GPS receiver is set, 1 PPS can be generated as long as the satellite signal can be received from at least one GPS satellite.

Here, in terrestrial digital broadcasting, a reference signal generation device including the GPS receiver and an atomic oscillator is used. Because the terrestrial digital broadcasting is public broadcasting, suspension of the broadcasting occurring due to failure in the atomic oscillator is not permitted. Thus, generally, two reference signal generation devices are prepared, and one thereof is used. In a case where the reference signal generation device which is being used fails, switching to another reference signal generation device is performed.

JP-A-2011-155367 discloses a reference frequency generation device which includes a GPS receiver, an atomic oscillator, a crystal oscillator, and a phase locked loop (PLL), and outputs the 1 PPS. The reference frequency generation device is configured such that, firstly, the atomic oscillator is used, and in a case where the atomic oscillator fails, switching to the crystal oscillator is performed.

However, in the device disclosed in JP-A-2011-155367, switching to the crystal oscillator is performed after the atomic oscillator fails. Thus, using such a device for satisfying a strict request as in the terrestrial digital broadcasting is difficult.

SUMMARY

An advantage of some aspects of the invention is to provide a reference signal generation device which enables detection of a sign of failure before the atomic oscillator completely fails, and to provide an electronic device, a moving object, a data communication device, and a terrestrial digital communication network.

The invention can be implemented as the following forms or application examples.

APPLICATION EXAMPLE 1

A reference signal generation device according to this application example includes a reception unit that receives a reference signal, a first oscillator that includes an atomic oscillator, a first phase comparator that compares a signal output from the first oscillator and the reference signal in phase, a second oscillator that generates a signal to be output outwardly, and a second phase comparator that compares the signal output from the first oscillator and a signal output from the second oscillator in phase. The first oscillator includes a sweeping-result output unit that outputs a sweeping result signal corresponding to a resonance signal obtained by performing frequency sweeping in the first oscillator. The reference signal generation device further includes a determination section that determines a failure state based on the sweeping result signal and at least one of a phase comparison signal of the first phase comparator and a phase comparison signal of the second phase comparator.

With this configuration, it is possible to detect a sign of failure before the atomic oscillator completely fails.

APPLICATION EXAMPLE 2

In the reference signal generation device according to the application example, it is preferable that the reception unit is a receiver that receives a satellite signal transmitted from a position information satellite.

With this configuration, it is possible to output a reference signal having high frequency accuracy outwardly.

APPLICATION EXAMPLE 3

In the reference signal generation device according to the application example, it is preferable that the determination section includes a failure storage unit that stores the failure state corresponding to the phase comparison signal and the sweeping result signal.

With this configuration, it is possible to recognize that failure may occur, before the atomic oscillator completely fails. Accordingly, it is possible to detect and deal with a sign of failure before the atomic oscillator completely fails.

APPLICATION EXAMPLE 4

In the reference signal generation device according to the application example, it is preferable that the determination section includes a sweeping-result storage unit for storing a plurality of sweeping results, and uses the changed quantity of the sweeping results in determination of the failure state.

With this configuration, it is possible to appropriately determine the failure state of the atomic oscillator.

APPLICATION EXAMPLE 5

In the reference signal generation device according to the application example, it is preferable that the determination section determines the failure state based on the phase comparison signal of the first phase comparator, the phase comparison signal of the second phase comparator, and the sweeping result signal.

With this configuration, it is possible to appropriately determine a failure state of the reference signal generation device.

APPLICATION EXAMPLE 6

It is preferable that the reference signal generation device according to the application example further includes an information output unit that outputs a signal including predetermined information, based on a determination result of the determination section.

With this configuration, it is possible to recognize that failure may occur, before the atomic oscillator completely fails. Accordingly, it is possible to detect and deal with a sign of failure before the atomic oscillator completely fails.

APPLICATION EXAMPLE 7

An electronic device according to this application example includes the reference signal generation device according to the application examples.

With this configuration, it is possible to detect and deal with a sign of failure before the atomic oscillator completely fails.

APPLICATION EXAMPLE 8

A moving object according to this application example includes the reference signal generation device according to the application examples.

With this configuration, it is possible to detect and deal with a sign of failure before the atomic oscillator completely fails.

APPLICATION EXAMPLE 9

A data communication device according to this application example includes the reference signal generation device according to the application examples.

With this configuration, it is possible to detect and deal with a sign of failure before the atomic oscillator completely fails.

APPLICATION EXAMPLE 10

A terrestrial digital communication network according to this application example includes the reference signal generation device according to the application examples.

With this configuration, it is possible to detect and deal with a sign of failure before the atomic oscillator completely fails.

BRIEF DESCRIPTION OF THE DRAWINGS

The invention will be described with reference to the accompanying drawings, wherein like numbers reference like elements.

FIG. 5 is a diagram illustrating a table for describing an operation of the reference signal generation device illustrated in FIG. 1.

FIG. 6 is a diagram illustrating a table for describing an operation of the reference signal generation device illustrated in FIG. 1.

DESCRIPTION OF EXEMPLARY EMBODIMENTS

Hereinafter, a reference signal generation device, an electronic device, a moving object, a data communication device, and a terrestrial digital communication network according to the invention will be described in detail, based on an embodiment illustrated in the accompanying drawings.

1. Reference Signal Generation Device

Figure 1:
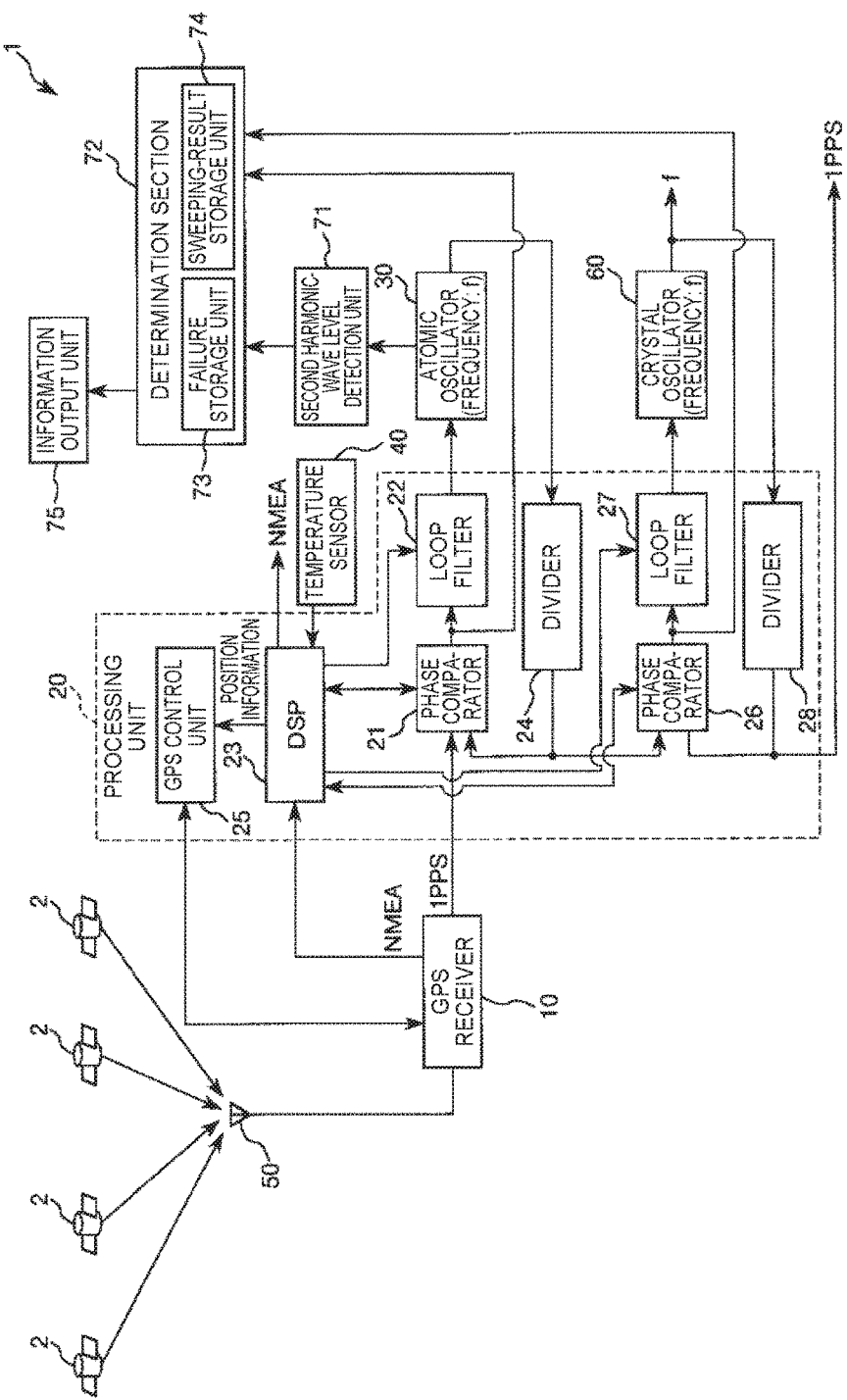
FIG. 1 is a schematic diagram illustrating a configuration of an embodiment of a reference signal generation device according to the invention.
Figure 2A:
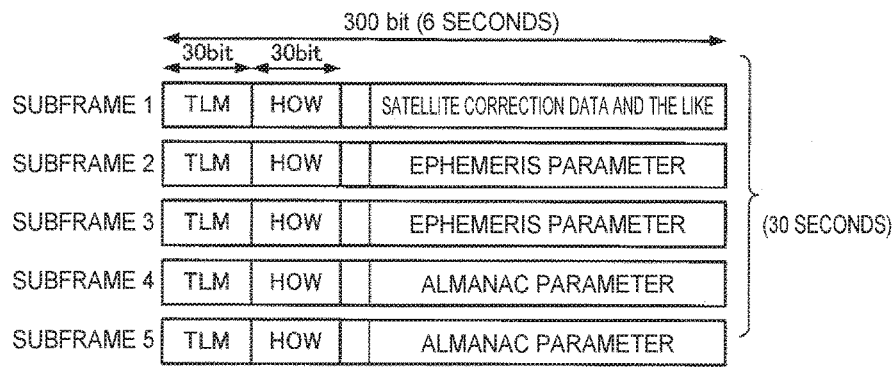
FIGS. 2A to 2C are diagrams illustrating a configuration of a navigation message transmitted from a GPS satellite.
Figure 2B:
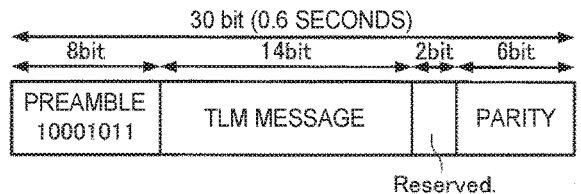
Figure 2C:
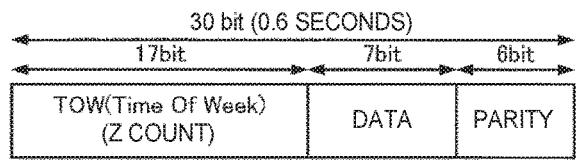
Figure 3:
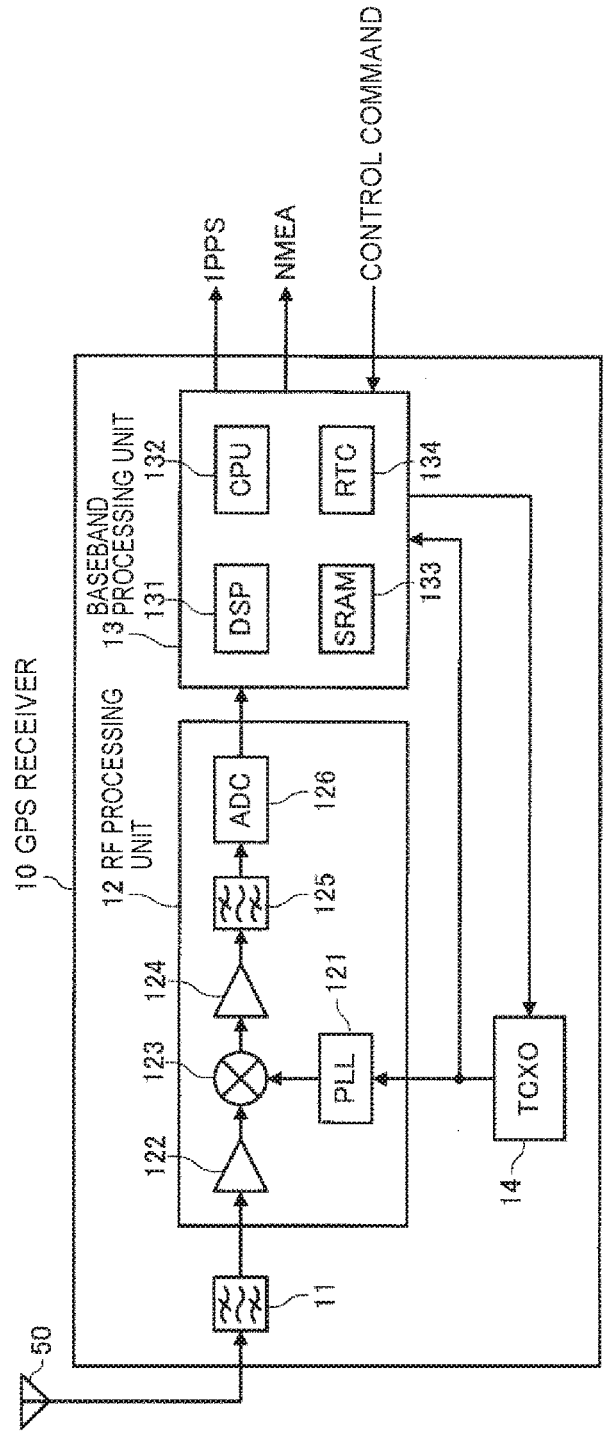
FIG. 3 is a block diagram illustrating a configuration example of a GPS receiver included in the reference signal generation device illustrated in FIG. 1.
Figure 4:
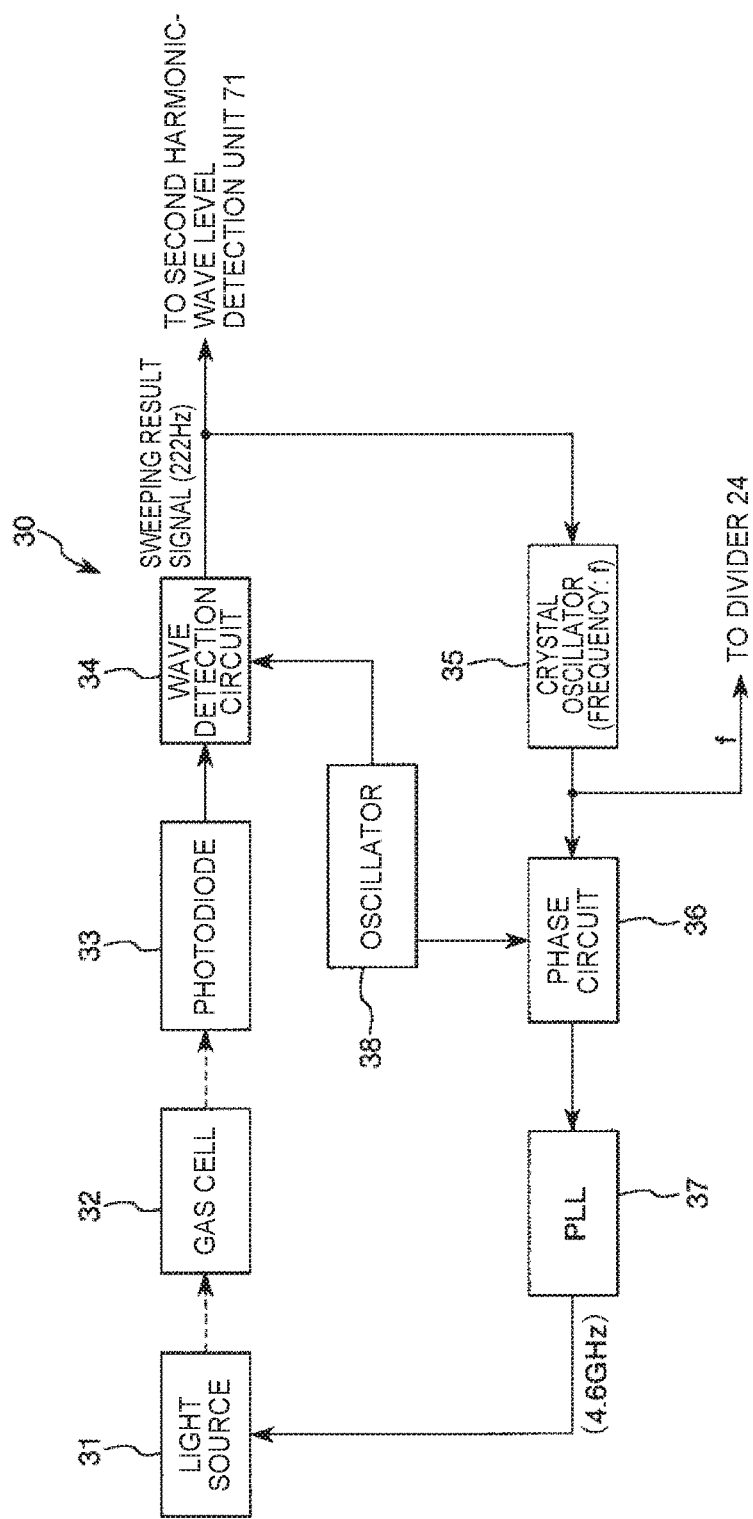
FIG. 4 is a block diagram illustrating a configuration example of an atomic oscillator included in the reference signal generation device illustrated in FIG. 1.

FIG. 1 is a schematic diagram illustrating a configuration of an embodiment of the reference signal generation device according to the invention. FIGS. 2A to 2C are diagrams illustrating a configuration of a navigation message transmitted from a GPS satellite. FIG. 3 is a block diagram illustrating a configuration example of a GPS receiver included in the reference signal generation device illustrated in FIG. 1. FIG. 4 is a block diagram illustrating a configuration example of an atomic oscillator included in the reference signal generation device illustrated in FIG. 1. FIGS. 5 and 6 are diagrams illustrating tables for describing an operation of the reference signal generation device illustrated in FIG. 1.

The reference signal generation device 1 illustrated in FIG. 1 includes a GPS receiver (receiver) 10 as a satellite signal reception unit (reception unit), a processing unit (CPU) 20 as a satellite signal reception control device, an atomic oscillator (first oscillator) 30, a temperature sensor 40, a crystal oscillator (second oscillator) 60, a second harmonic-wave level detection unit 71, a determination section 72, an information output unit 75, and a GPS antenna 50.

Some or all of the components of the reference signal generation device 1 may be physically separated or may be integrated. For example, each of the GPS receiver 10 and the processing unit 20 may be realized by using an individual IC. The GPS receiver 10 and the processing unit 20 may be realized as a one-chip IC. Other components are similar to the above case.

The reference signal generation device 1 receives a signal transmitted from a GPS satellite (navigation satellite) 2 as a position information satellite, and generates 1 PPS with high accuracy.

The GPS satellite 2 revolves on a predetermined orbit over the Earth and transmits a satellite signal (GPS signal) to the ground. The satellite signal is obtained by superimposing a navigation message and a C/A code (coarse/ acquisition Code) on a radio wave (L1 wave) of 1.57542 GHz serving as a carrier wave (by modulating the carrier wave). The satellite signal is an example of a reference signal input to the reference signal generation device 1 from the outside of the device 1.

The C/A code is used for identifying satellite signals of GPS satellites 2 of which the number is currently about 30. The C/A code has a unique pattern formed from 1023 chips (cycle of 1 ms) of which each has a value of either of +1 and −1. Accordingly, correlation between the satellite signal and the pattern of the C/A code is obtained, and thus, it is possible to detect a C/A code superimposed on the satellite signal.

The satellite signal (specifically, navigation message) transmitted by each of the GPS satellite 2 includes orbit information indicating a position of the corresponding GPS satellite 2 on an orbit thereof. Each of the GPS satellites 2 has an atomic clock mounted therein and the satellite signal includes very precise time information clocked by the atomic clock. Accordingly, satellite signals are received from four or more GPS satellites 2, positioning calculation is performed by using orbit information and time information which are included in each of the received satellite signals, and thus it is possible to obtain accurate information about a position and a point of time of a reception point (installation place of the GPS antenna 50). Specifically, a quartic equation in which a three-dimensional position (x, y, z) of the reception point and a point t of time functions as four variables may be established and the solution thereof may be obtained.

In a case where the position of a reception point is already known, satellite signals may be received from one GPS satellite 2 or more, and time information at the reception point may be obtained by using time information included in each of the satellite signals.

Information about a difference between a point of time in each of the GPS satellites 2 and a point of time at the reception point may be obtained by using orbit information included in each of the satellite signals. A control segment on the ground measures a small time error of the atomic clock mounted in each of the GPS satellites 2, and the satellite signal also includes a time correction parameter for correcting the time error. Accordingly, a point of time at the reception point is corrected by using the time correction parameter, and thus very precise time information may be obtained.

As illustrated in FIG. 2A, the navigation message is configured as data in which a main frame of 1500 bits which is the number of all bits is used as one unit. The main frame is divided into five subframes 1 to 5 of 300 bits. Data of one subframe is transmitted from each of the GPS satellites 2 for 6 seconds. Accordingly, pieces of data of the one main frame are transmitted from the GPS satellites 2 for 30 seconds.

The subframe 1 includes satellite correction data such as week number data (WN). The week number data is information indicating a week in which a point of time at the GPS satellite 2 is included. A start point of the time of the GPS satellite 2 is 00:00:00 Jan. 6, 1980 in the coordinated universal time (UTC), and a week which starts from a day of the start point has a week number of 0. The week number data is updated for each week.

The subframes 2 and 3 include an ephemeris parameter (detailed orbit information of each of the GPS satellites 2). The subframes 4 and 5 include an almanac parameter (schematic orbit information of all of the GPS satellites 2).

A TLM word and a HOW word are included at the leading of the subframes 1 to 5. TLM (telemetry) word data of 30 bits is stored in the TLM (telemetry) word, and HOW (hand over word) data of 30 bits is stored in the HOW word.

Accordingly, the TLM word or the HOW word is transmitted from the GPS satellite 2 at an interval of 6 seconds, but the ephemeris parameter, the almanac parameter, and the satellite correction data such as the week number data are transmitted at an interval of 30 seconds.

As illustrated in FIG. 2B, the TLM word includes preamble data, a TLM message, a Reserved bit, and parity data.

As illustrated in FIG. 2C, the HOW word includes time information referred to as TOW (time of week) (also referred to as "a Z count" below). In the Z count data, time elapsed from 00:00 on Sunday of every week is displayed in seconds, and the time returns to 0 at 00:00 on Sunday of the next week. That is, the Z count data is information of a unit of a second in which time from the beginning of a week is displayed for every week, and has a value obtained by representing the elapsed time in a unit of 1.5 seconds. Here, the Z count data indicates time information when the leading bit of the next subframe data is transmitted. For example, Z count data of the subframe 1 indicates time information when the leading bit of the subframe 2 is transmitted. The HOW word includes 3-bit data (ID code) which indicates the ID of a subframe. That is, HOW words of the subframes 1 to 5 illustrated in FIG. 2A respectively include IDs of "001", "010", "011", "100", and "101".

Week number data included in the subframe 1 and HOW words (pieces of Z count data) included in the subframes 1 to 5 are obtained, and thus a point of time at the GPS satellite 2 may be calculated. If the week number data is obtained in advance and elapsed time from the time when the week number data is obtained is counted in the device, the current week number data of the GPS satellite 2 may be obtained, even when the week number data is not obtained each time. Accordingly, if only the Z count data is obtained, the current point of time at the GPS satellite 2 may be known through estimation.

The above-described satellite signal is received by the GPS receiver 10 through the GPS antenna 50 illustrated in FIG. 1.

The GPS antenna 50 is an antenna that receives various radio waves including the satellite signal. The GPS antenna 50 is connected to the GPS receiver 10.

The GPS receiver 10 performs various types of processing based on the satellite signal received through the GPS antenna 50.

Specifically, the GPS receiver 10 has a normal positioning mode (first mode) and a position fixed mode (second mode). Either of the normal positioning mode and the position fixed mode is set in accordance with a control command (control command for setting a mode) from the processing unit (CPU) 20.

The GPS receiver 10 functions as "a positioning calculation unit" in the normal positioning mode. The GPS receiver 10 receives satellite signals transmitted from a plurality (preferably, 4 or more) of GPS satellites 2, and performs positioning calculation based on orbit information (specifically, the ephemeris parameter, the almanac parameter, or the like which is described above) included in the received satellite signal, and time information (specifically, the week number data, the Z count data, or the like which is described above). The GPS receiver 10 generates the following 1 PPS.

The GPS receiver 10 functions as "a timing signal generation unit" in the position fixed mode. The GPS receiver 10 receives satellite signals transmitted from at least one GPS satellite 2, and generates 1 pulse per second (1 PPS) based on orbit information and time information which are included in the received satellite signals, and position information of the reception point which has been set. 1 PPS is an example of a timing signal synchronized with a reference point of time. The 1 PPS is a pulse signal which is completely synchronized with the coordinated universal clock (UTC), and includes one pulse for each second. In this manner, the satellite signal used in generation of a timing signal by the GPS receiver 10 includes the orbit information and the time information, and thus a timing signal which is precisely synchronized with the reference point of time may be generated. The 1 PPS is an example of the reference signal.

Next, a configuration of the GPS receiver 10 will be described in detail.

The GPS receiver 10 illustrated in FIG. 3 includes a surface acoustic wave (SAW) filter 11, a RF processing unit 12, a baseband processing unit 13, and a temperature compensated crystal oscillator (TCXO) 14.

The SAW filter 11 performs processing of extracting a satellite signal from a radio wave received by the GPS antenna 50. The SAW filter 11 is configured as a bandpass filter through which a signal in a band of 1.5 GHz passes.

The RF processing unit 12 includes a phase locked loop (PLL) 121, a low noise amplifier (LNA) 122, a mixer 123, an IF amplifier 124, an intermediate frequency (IF) filter 125, and an analog-to-digital converter (ADC) 126.

The PLL 121 generates a clock signal obtained by multiplying an oscillation signal of the TOXO 14, which is oscillated at about tens of MHz so as to have a frequency of 1.5 GHz.

The LNA 122 amplifies the satellite signal extracted by the SAW filter 11. The mixer 123 mixes the satellite signal amplified by the LNA 122 with the clock signal output by the PLL 121, and thus the amplified satellite signal is down-converted into a signal (IF signal) in an intermediate frequency band (for example, several MHz). The signal obtained by mixing of the mixer 123 is amplified by the IF amplifier 124.

Since mixing of the mixer 123 causes a high frequency signal of the GHz order to be generated along with the IF signal, the IF amplifier 124 amplifies this high frequency signal along with the IF signal. The IF filter 125 passes through the IF signal and removes the high frequency signal (accurately, attenuated to be equal to or less than a predetermined level). The IF signal which has passed through the IF filter 125 is converted into a digital signal by the A/D converter (ADC) 126.

The baseband processing unit 13 includes a digital signal processor (DSP) 131, a central processing unit (CPU) 132, a static random access memory (SRAM) 133, and a real-time clock (RTC) 134. The baseband processing unit 13 performs various types of processing by using the oscillation signal of the TCXO 14 as a clock signal.

The DSP 131 and the CPU 132 demodulates a baseband signal from the IF signal, obtains orbit information or time information which is included in a navigation message, and performs processing of the normal positioning mode or processing of the position fixed mode, while cooperating with each other.

The SRAM 133 is used for storing the time information or the orbit information which is obtained, position information of the reception point which is set in accordance with a predetermined control command (control command for setting a position), an elevation angle mask used in, for example, the position fixed mode, and the like. The RTC 134 generates a timing for performing baseband processing. A value of the RTC 134 is counted up by using a clock signal from the TCXO 14.

Specifically, the baseband processing unit 13 generates a local code having a pattern the same as each C/A code, and performs processing (satellite searching) of obtaining correlation between each C/A code included in the baseband signal, and the local code. The baseband processing unit 13 adjusts a timing of generating the local code such that a correlation value with respect to each of local codes becomes a peak. In a case where the correlation value is equal to or greater than a threshold value, the baseband processing unit 13 determines that synchronization with a GPS satellite 2 of which the local code corresponds to the C/A code is performed (the GPS satellite 2 is acquired). In the GPS, a code division multiple access (CDMA) method is employed. In the CDMA method, all GPS satellites 2 transmit satellite signals having the same frequency, by using different C/A codes. Accordingly, the C/A code included in the received satellite signal is determined and thus an acquirable GPS satellite 2 may be searched for.

The baseband processing unit 13 performs processing of mixing a local code having the same pattern as the C/A code of the acquired GPS satellite 2, with the baseband signal in order to obtain orbit information or time information of the acquired GPS satellite 2. A signal obtained by mixing includes a navigation message which includes the orbit information or the time information of the acquired GPS satellite 2 and is demodulated. The baseband processing unit 13 performs processing of obtaining the orbit information or the time information included in the navigation message, and storing the obtained information in the SRAM 133.

The baseband processing unit 13 receives a predetermined control command (specifically, control command for setting a mode), and performs setting of either of the normal positioning mode and the position fixed mode. In the normal positioning mode, the baseband processing unit 13 performs positioning calculation by using pieces of the orbit information and the time information of four or more GPS satellites 2, which are stored in the SRAM 133.

In the position fixed mode, the baseband processing unit 13 outputs 1 PPS which is high precise, by using pieces of orbit information of one or more GPS satellites 2, which are stored in the SRAM 133, and the position information of the reception point stored in the SRAM 133. Specifically, the baseband processing unit 13 includes an 1-PPS counter in a portion of the RTC 134. The 1-PPS counter counts a timing of generating a pulse at 1 PPS. The baseband processing unit 13 calculates a propagation delay period required for causing a satellite signal transmitted from the GPS satellite 2 to reach the reception point, by using the orbit information of the GPS satellite 2 and the position information of the reception point. The baseband processing unit 13 changes a setting value of the 1-PPS counter to the optimum value based on the calculated propagation delay period.

In the normal positioning mode, the baseband processing unit 13 outputs the 1 PPS based on the time information of the reception point obtained through the positioning calculation.

In the position fixed mode, if a plurality of GPS satellites 2 is acquired, the positioning calculation may be performed.

The baseband processing unit 13 outputs NMEA data which includes various types of information such as the position information or the time information obtained as results of the positioning calculation, and a reception status (the number of acquired GPS satellites 2, intensity of the satellite signal, and the like).

An operation of the GPS receiver 10 configured as described above is controlled by the processing unit (CPU) 20 illustrated in FIG. 1.

The processing unit 20 transmits various control commands to the GPS receiver 10 so as to control the operation of the GPS receiver 10. The processing unit 20 receives the 1 PPS or the NMEA data which is output by the GPS receiver 10, and performs various types of processing. The processing unit 20 may perform various types of processing in accordance with, for example, a program stored in a certain memory.

The processing unit 20 includes a phase comparator (first phase comparator) 21, a loop filter 22, a digital signal processor (DSP) 23, a divider 24, a GPS control unit (reception control unit) 25, a phase comparator (second phase comparator) 26, a loop filter 27, and a divider 28. The DSP 23 and the GPS control unit 25 may be configured in one component.

The DSP 23 obtains NMEA data from the GPS receiver 10 periodically (for example, for each second). The DSP 23 collects pieces of position information (result of the positioning calculation in the normal positioning mode by the GPS receiver 10) included in pieces of NMEA data, and creates statistical information for a predetermined period. The DSP 23 performs processing of generating position information of the reception point based on the created statistical information. Particularly, the DSP 23 generates the position information of the reception point based on a representative value (for example, average value, most frequent value, or median value) of plural results of the positioning calculation in the normal positioning mode by the GPS receiver 10.

The GPS control unit 25 transmits various control commands to the GPS receiver 10 so as to control an operation of the GPS receiver 10. Specifically, the GPS control unit 25 transmits a control command for setting a mode to the GPS receiver 10, and performs processing of causing the mode of the GPS receiver 10 to be switched from the normal positioning mode to the position fixed mode. Before the GPS control unit 25 switches the mode of the GPS receiver 10 from the normal positioning mode to the position fixed mode, the GPS control unit 25 transmits a control command for setting a position to the GPS receiver 10, and performs processing of setting the position information of the reception point, which has been generated by the DSP 23, in the GPS receiver 10.

The divider 24 performs f-division on the clock signal (frequency: f) which is output by the atomic oscillator 30, so as to output a division clock signal of 1 Hz.

The phase comparator 21 performs phase comparison between 1 PPS output by the GPS receiver 10 and the division clock signal of 1 Hz output by the divider 24. A phase comparison signal is a phase difference signal as a comparison result of the phase comparator 21. The phase comparison signal is input to the loop filter 22. The loop filter 22 generates a control voltage signal (control voltage) of a crystal oscillator 35 (see FIG. 4) which functions as a voltage controlled oscillator (VCO), based on the phase comparison signal. The voltage controlled oscillator is provided in the atomic oscillator 30 and will be described later. The loop filter 22 outputs the generated control voltage signal toward the crystal oscillator 35. Parameters of the loop filter 22 are set by the DSP 23.

The division clock signal of 1 Hz output by the divider 24 is synchronized with 1 PPS output by the GPS receiver 10. The division clock signal is output as 1 PPS which has been synchronized with the UTC and has very high frequency accuracy, toward the phase comparator 26.

That is, the crystal oscillator 35 is configured so as to adjust a frequency by using the control voltage signal which corresponds to an output voltage of the loop filter 22. As described above, the phase comparator 21, the loop filter 22, the DSP 23, and the divider 24 cause a clock signal output by the crystal oscillator 35 to be completely synchronized with 1 PPS output by the GPS receiver 10. A configuration formed by the phase comparator 21, the loop filter 22, the DSP 23, and the divider 24 function as "a synchronization control unit" that synchronizes the clock signal which is output by the crystal oscillator 35 (atomic oscillator 30), with 1 PPS.

The phase comparison signal of the phase comparator 21 is input to the determination section 72, and is used in determination of a failure state by the determination section 72.

The atomic oscillator 30 is an oscillator that outputs a clock signal of high frequency accuracy by using atomic energy transition. As the atomic oscillator 30, for example, an atomic oscillator using a rubidium atom or a cesium atom is widely known. Examples of the atomic oscillator 30 may include an atomic oscillator using an electromagnetically induced transparency (EIT) phenomenon (may be also referred to as "a coherent population trapping (CPT) phenomenon), an atomic oscillator using an optical microwave double resonance phenomenon, and the like. The atomic oscillator 30 will be described later.

The divider 28 performs f-division on the clock signal (frequency: f) which is output by the crystal oscillator 60, so as to output a division clock signal of 1 Hz.

The phase comparator 26 performs phase comparison between the division clock signal of 1 Hz output by the divider 24, and the division clock signal of 1 Hz output by the divider 28. A phase comparison signal is a phase difference signal as a comparison result of the phase comparator 26. The phase comparison signal is input to the loop filter 27. The loop filter 27 generates a control voltage signal (control voltage) of a crystal oscillator 60 which functions as a voltage controlled oscillator (VCO), based on the phase comparison signal. The loop filter 27 outputs the generated control voltage signal toward the crystal oscillator 60. Parameters of the loop filter 27 are set by the DSP 23.

The division clock signal of 1 Hz output by the divider 28 is synchronized with the division clock signal of 1 Hz output by the divider 24, that is, 1 PPS output by the GPS receiver 10. The reference signal generation device 1 outputs the division clock signal outwardly as 1 PPS (reference signal) which has been synchronized with the UTC and has very high frequency accuracy.

That is, the crystal oscillator 60 is configured so as to adjust a frequency by using the control voltage signal which corresponds to an output voltage of the loop filter 27. As described above, the phase comparator 26, the loop filter 27, the DSP 23, and the divider 28 cause a clock signal output by the crystal oscillator 60 to be completely synchronized with 1 PPS output by the GPS receiver 10. A configuration formed by the phase comparator 26, the loop filter 27, the DSP 23, and the divider 28 functions as "a synchronization control unit" that synchronizes the clock signal which is output by the crystal oscillator 60, with 1 PPS.

The phase comparison signal of the phase comparator 26 is input to the determination section 72, and is used in determination of a failure state (which will be described later) by the determination section 72.

The crystal oscillator 60 is not particularly limited, and examples of the crystal oscillator 60 include an oven controlled crystal oscillator (OCXO), a temperature compensated crystal oscillator (TCXO), and the like. In the embodiment, the crystal oscillator 60 is used as a second oscillator, but it is not limited thereto. For example, an atomic oscillator and the like may be used as the second oscillator.

The temperature sensor 40 is disposed in the vicinity of the atomic oscillator 30 and the crystal oscillator 60. The DSP 23 adjusts the control voltage signals of the crystal oscillator 35 (which is provided in the atomic oscillator 30), and the crystal oscillator 60, in accordance with a detection value (detected temperature) of the temperature sensor 40, and thereby performs processing in which frequency-temperature characteristics of the crystal oscillators 35 and 60 are subjected to temperature compensation (temperature correction).

If a situation (hold-over) where reception of a satellite signal by the GPS receiver 10 is not possible occurs, the precision of 1 PPS output by the GPS receiver 10 is lowered or the output of 1 PPS by the GPS receiver 10 is suspended. In such a case, the processing unit 20 may suspend processing of synchronizing the clock signal output by the atomic oscillator 30 with 1 PPS output by the GPS receiver 10, so as to cause the atomic oscillator 30 to perform free-running oscillation. With such an operation, the reference signal generation device 1 can output 1 PPS having high frequency accuracy by free-running oscillation of the atomic oscillator 30, even when the precision of 1 PPS output by the GPS receiver 10 is lowered.

The reference signal generation device 1 outputs the latest NMEA data outwardly for each second, with synchronization with 1 PPS. The reference signal generation device 1 also outputs a clock signal which is output by the crystal oscillator 60 and has a frequency of f outwardly.

The determination section 72 has a function of determining a failure state of the reference signal generation device 1. The determination section 72 includes a failure storage unit 73 and a sweeping-result storage unit 74. The failure storage unit 73 stores failure information of the reference signal generation device 1 (which will be described later), and the like. The sweeping-result storage unit 74 stores a plurality of sweeping results (which will be described later), and the like.

The information output unit 75 has a function of outputting a signal (alarm and the like) based on a determination result of the determination section 72, which includes predetermined information. The signal is transmitted to, for example, a terminal device (not illustrated) which is connected to the information output unit 75.

A sweeping result signal (which will be described later) of the atomic oscillator 30 is input to the second harmonic-wave level detection unit 71. The second harmonic-wave level detection unit 71 has a function of detecting amplitude (level) of the sweeping result signal. A signal including information of the amplitude of the sweeping result signal is input to the determination section 72, and is used in determination of the failure state (which will be described later) by the determination section 72.

Next, the atomic oscillator 30 will be described.

As illustrated in FIG. 4, the atomic oscillator 30 includes a light source (light emitting unit) 31, a gas cell 32, a photodiode (light receiving unit) 33, a wave detection circuit (sweeping-result output unit) 34, a crystal oscillator (voltage-controlled crystal oscillator: VCXO) 35 as a voltage controlled oscillator (VCO), a phase circuit 36, a PLL 37, and an oscillator 38.

As the light source 31, for example, a semiconductor laser and the like may be used.

Gaseous alkali metal such as rubidium, cesium, and sodium is sealed in the gas cell 32.

The photodiode 33 receives light which has been emitted from the light source 31 and transmitted through the gas cell 32. The photodiode 33 performs photoelectric conversion on the received light, and outputs a signal obtained by performing photoelectric conversion, as an electrical signal.

The crystal oscillator 35 is not particularly limited, and examples of the crystal oscillator 35 include an oven controlled crystal oscillator (OCXO), a temperature compensated crystal oscillator (TCXO), and the like.

The wave detection circuit 34 has a function of outputting a sweeping result signal which corresponds to a resonance signal (EIT signal) obtained by frequency sweeping of the atomic oscillator 30.

The sweeping result signal generated by the atomic oscillator 30 will be described below. For easy understandings, as an example, the frequency of a signal will be described by using a specific numerical value.

Firstly, gaseous rubidium (in which a frequency ω0 causing atomic resonance is 9.2 GHz) is sealed in the gas cell 32, and an oscillator that outputs a signal of 111 Hz is set as the oscillator 38.

The phase circuit 36 modulates a signal (frequency: f) output from the crystal oscillator 35, at a frequency of 111 Hz. The PLL 37 multiplies a signal output from the phase circuit 36 by $4.6 \times 10^5$ (frequency: 4.6 GHz), and outputs a signal obtained by multiplication, to the light source 31.

In this manner, if frequency sweeping is performed on a signal having a frequency of 111 Hz, the atomic resonance phenomenon, that is, the electromagnetically induced transparency (EIT) phenomenon occurs in the gas cell 32 at a predetermined timing, and an atomic resonance signal (EIT signal) is generated. The atomic resonance signal corresponds to a steep signal generated in accordance with the EIT phenomenon.

In a case where the atomic resonance does not occur, a signal having a frequency of 111 Hz is input to the wave detection circuit 34 from the photodiode 33.

However, if the atomic resonance occurs, the signal having a frequency of 111 Hz is not input, but a signal having a frequency of 222 Hz (that is, second harmonic wave for 111 Hz) is input to the wave detection circuit 34 from the photodiode 33. The signal having a frequency of 222 Hz when the atomic resonance occurs corresponds to the sweeping result signal. The sweeping result signal is output to the second harmonic-wave level detection unit 71 from the wave detection circuit 34.

The wave detection circuit 34 performs control so as to cause the amplitude of the signal which has a frequency of 111 Hz and is input to the wave detection circuit 34 from the photodiode 33, to be 0, that is, so as to cause the signal having a frequency of 111 Hz, not to be input to the wave detection circuit 34 from the photodiode 33.

The reference signal generation device 1 is configured so as to enable detection of a sign of failure before the atomic oscillator 30 of the reference signal generation device 1 completely fails (abrasion failure). Such a configuration will be described below.

Firstly, there are two major reasons of abrasion failure in the atomic oscillator 30. These are deterioration of the light source 31, and reduction of alkali metal and clouding in the gas cell 32. The abrasion failure does not temporarily occur. That is, failure gradually proceeds and if a predetermined period elapses, finally, failure is completed.

If abrasion failure in the atomic oscillator 30 starts, the amplitude of the sweeping result signal (signal of 222 Hz in the embodiment) (which will be described later) is reduced. The sweeping result signal corresponds to a resonance signal (EIT signal) of the atomic oscillator 30. That is, the amplitude of the sweeping result signal varies depending on the variance of the amplitude of the resonance signal of the atomic oscillator 30.

In the reference signal generation device 1, the determination section 72 determines the failure state of the reference signal generation device 1 based on the sweeping result signal, the phase comparison signal of the phase comparator 21, the phase comparison signal of the phase comparator 26.

That is, the determination section 72 firstly calculates an abrasion failure level fluctuation rate A represented by the following expression (1).

$$A=[\{(\text{amplitude of the initial sweeping result signal})-(\text{amplitude of the current sweeping result signal})\}/(\text{amplitude of the initial sweeping result signal})]\times 100 \quad (1)$$

In a case where the abrasion failure level fluctuation rate A is equal to or greater than a threshold value B, determination to be "abnormality" is performed. In a case of being less than the threshold value B, determination to be "normality" is performed.

The threshold value B is not particularly limited, and may be appropriately set in conditions. In the embodiment, the threshold value B is set to 1%, for example. Thus, in a case where the abrasion failure level fluctuation rate A is equal to or greater than 1%, determination to be "abnormality" is performed, and in a case of being less than 1%, determination to be "normality" is performed.

The amplitude of the initial sweeping result signal and the amplitude of the current sweeping result signal are stored as sweeping results, in the sweeping-result storage unit 74. The abrasion failure level fluctuation rate A is stored as a fluctuation rate of the sweeping results, in the sweeping-result storage unit 74.

The determination section 72 determines normality or abnormality based on the phase comparison signal of the phase comparator 21. A case where a phase difference indicated by the phase comparison signal is large means that abnormality occurs in at least one of the GPS receiver 10 side and the atomic oscillator 30 side.

In the embodiment, determination to be "abnormality" is performed in a case where the phase difference indicated by the phase comparison signal of the phase comparator 21 is equal to or greater than a threshold value a. In a case of being less than the threshold value a, determination to be "normality" is performed.

The determination section 72 determines normality or abnormality based on the phase comparison signal of the phase comparator 26. A case where a phase difference indicated by the phase comparison signal is large means that abnormality occurs in at least one of the crystal oscillator 60 side and the atomic oscillator 30 side.

In the embodiment, determination to be "abnormality" is performed in a case where the phase difference indicated by the phase comparison signal of the phase comparator 26 is equal to or greater than a threshold value b. In a case of being less than the threshold value b, determination to be "normality" is performed.

The threshold values a and b are not particularly limited, and may be appropriately set in conditions. However, the threshold values a and b are preferably set to values in a range of 0.1 μs to 10 μs, and more preferably set to values in a range of 0.2 μs to 5 μs. The threshold value a and the threshold value b may be the same as each other or different from each other.

As illustrated in FIG. 5, the determination section determines the failure state of the reference signal generation device 1, and sets a status. The determination of the failure state is performed based on a determination result of normality/abnormality which is performed based on the abrasion failure level fluctuation rate A, a determination result of normality/abnormality which is performed based on the phase comparison signal of the phase comparator 21, a determination result of normality/abnormality which is performed based on the phase comparison signal of the phase comparator 26. Information of the failure state is stored in the failure storage unit 73. A signal including the information of the failure state is output outwardly from the information output unit 75.

In a case where the determination result based on the abrasion failure level fluctuation rate A is "abnormality", the determination result based on the phase difference of the phase comparator 21 is "normality", and the determination result based on the phase difference of the phase comparator 26 is "normality", the status is set to "an abrasion failure mode". The "abrasion failure mode" of this status indicates that the abrasion failure in the atomic oscillator 30 has started.

In a case where the determination result based on the abrasion failure level fluctuation rate A is "abnormality", the determination result based on the phase difference of the phase comparator 21 is "abnormality", and the determination result based on the phase difference of the phase comparator 26 is "normality", the status is set to "a reception fault of a satellite signal". The "reception fault of a satellite signal" of this status indicates that fault relating to the reception of a satellite signal occurs.

In a case where the determination result based on the abrasion failure level fluctuation rate A is "abnormality", the determination result based on the phase difference of the phase comparator 21 is "normality", and the determination result based on the phase difference of the phase comparator 26 is "abnormality", the status is set to "failure". The "failure" of this status indicates that any failure occurs.

In a case where the determination result based on the abrasion failure level fluctuation rate A is "abnormality", the determination result based on the phase difference of the phase comparator 21 is "abnormality", and the determination result based on the phase difference of the phase comparator 26 is "abnormality", the status is set to "failure". The "failure" of this status indicates that any failure occurs.

In a case where the determination result based on the abrasion failure level fluctuation rate A is "normality", the determination result based on the phase difference of the phase comparator 21 is "abnormality", and the determination result based on the phase difference of the phase comparator 26 is "abnormality", the status is set to "failure in components other than the atomic oscillator". The "failure in components other than the atomic oscillator" of the status indicates that failure occurs in components other than the atomic oscillator 30.

In a case where determination using the abrasion failure level fluctuation rate A is "normality", determination relating to the phase comparator 21 is "normality", and determination relating to the phase comparator 26 is "normality", the status is set to "normality". The "normality" of the status indicates that the reference signal generation device 1 is operated normally.

In the reference signal generation device 1, the determination section 72 estimates a lifetime of the atomic oscillator 30 based on the abrasion failure level fluctuation rate A, and predicts a period until the atomic oscillator 30 completely fails (abrasion failure). In the embodiment, as illustrated in FIG. 6, the determination section 72 sets the status based on the abrasion failure level fluctuation rate A. Information regarding the lifetime of the atomic oscillator 30 is stored in the failure storage unit 73. A signal which includes the information regarding the lifetime of the atomic oscillator 30 is output outwardly from the information output unit 75.

In a case where the abrasion failure level fluctuation rate A is 1%, the determination section 72 estimates that atomic oscillator 30 will completely fail within three months, and sets the status to "complete failure within about three months".

In a case where the abrasion failure level fluctuation rate A is 5%, the determination section 72 estimates that atomic oscillator 30 will completely fail within one month, and sets the status to "complete failure within about one month".

In a case where the abrasion failure level fluctuation rate A is 10%, the determination section 72 estimates that atomic oscillator 30 will completely fail within one week, and sets the status to "complete failure within about one week".

In a case where the abrasion failure level fluctuation rate A is 20%, the determination section 72 estimates that atomic oscillator 30 will completely fail within one day, and sets the status to "complete failure within about one day".

In the embodiment, for example, the threshold value of the abrasion failure level fluctuation rate A is set to 10%. In this case, if the abrasion failure level fluctuation rate A is equal to or less than 10%, a signal which includes information regarding "complete failure within about one week" is output outwardly from the information output unit 75.

A period of one week is a period sufficient for replacing the reference signal generation device 1. Thus, a worker can perform a work and the like of replacing the reference signal generation device 1, with sufficient spare time.

As described above, in the reference signal generation device 1, it is possible to detect a sign of failure before the atomic oscillator 30 completely fails. Accordingly, it is possible to deal with the failure before the atomic oscillator 30 completely fails.

In the embodiment, a signal including information is output from the information output unit 75, and thus it is possible to prepare predetermined countermeasures for failure, based on the information.

As the countermeasures, for example, replacement of the reference signal generation device 1 with another normal reference signal generation device 1, replacement of the atomic oscillator 30 with another normal atomic oscillator 30, and the like are exemplified.

As other configurations, the following Configuration 1 and Configuration 2 are exemplified.

Configuration 1

A configuration in which two reference signal generation device 1 are provided, and if a sign of failure is detected, switching to a normal reference signal generation device 1 is automatically performed may be made.

Configuration 2

A configuration in which if a sign of failure is detected, switching from the atomic oscillator 30 to a crystal oscillator (not illustrated) is automatically performed may be made.

2. Electronic Device

Next, an embodiment of an electronic device according to the invention will be described.

Figure 7:
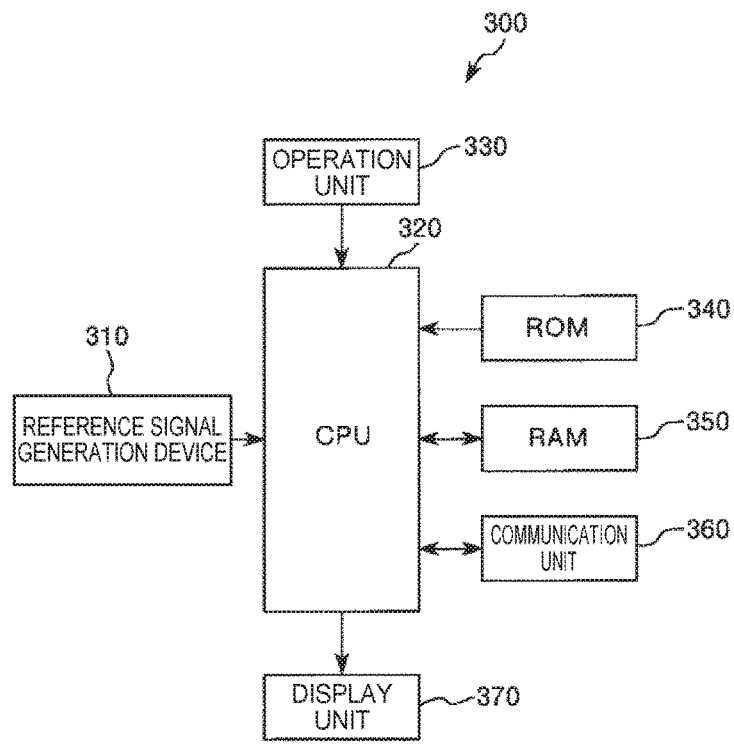
FIG. 7 is a block diagram illustrating an embodiment of an electronic device according to the invention.

FIG. 7 is a block diagram illustrating the embodiment of the electronic device according to the invention.

The electronic device 300 illustrated in FIG. 7 includes a reference signal generation device 310, a central processing unit (CPU) 320, an operation unit 330, a read only memory (ROM) 340, a random access memory (RAM) 350, a communication unit 360, and a display unit 370.

The above-described reference signal generation device 1 is applied as the reference signal generation device 310. The reference signal generation device 310 receives a satellite signal and generates a timing signal (1 PPS) having high precision, and outputs the generated timing signal outwardly, as described before. Thus, it is possible to realize the electronic device 300 with low cost and high reliability.

The CPU 320 performs various types of calculation processing or control processing, in accordance with a program stored in the ROM 340 and the like. Specifically, the CPU 320 performs types of processing with synchronization with the timing signal (1PPS) or a clock signal which is output by the reference signal generation device 310. Examples of the performed processing include clocking processing, various types of processing performed in accordance with an operation signal from the operation unit 330, processing of controlling the communication unit 360 so as to perform data communication with the outside of the electronic device, and processing of transmitting a display signal so as to display various types of information about the display unit 370.

The operation unit 330 is an input device configured by operation keys, button switches, or the like. The operation unit 330 outputs an operation signal to the CPU 320 in accordance with an operation by a user.

The ROM 340 stores a program, data, or the like required for causing the CPU 320 to perform various types of calculation processing or control processing.

The RAM 350 is used as a work area of the CPU 320. The RAM 350 temporarily stores a program or data which has been read from the ROM 340, data input from the operation unit 330, computation results obtained by performing of the CPU 320 in accordance with various programs, and the like.

The communication unit 360 performs various types of processing for establishing data communication between the CPU 320 and an external device.

The display unit 370 is a display device configured by a liquid crystal display (LCD) and the like. The display unit 370 displays various types of information based on a display signal input from the CPU 320. A touch panel that functions as the operation unit 330 may be provided in the display unit 370.

Various electronic devices are considered as such an electronic device 300, and the electronic device 300 is not particularly limited. For example, a server (time server) for managing points of time, in which synchronization with a reference point of time is realized, a time management device (time stamp server) that performs issue of a time stamp, and the like, a frequency reference device such as a base station are exemplified.

3. Moving Object

Next, an embodiment of a moving object according to the invention will be described.

Figure 8:
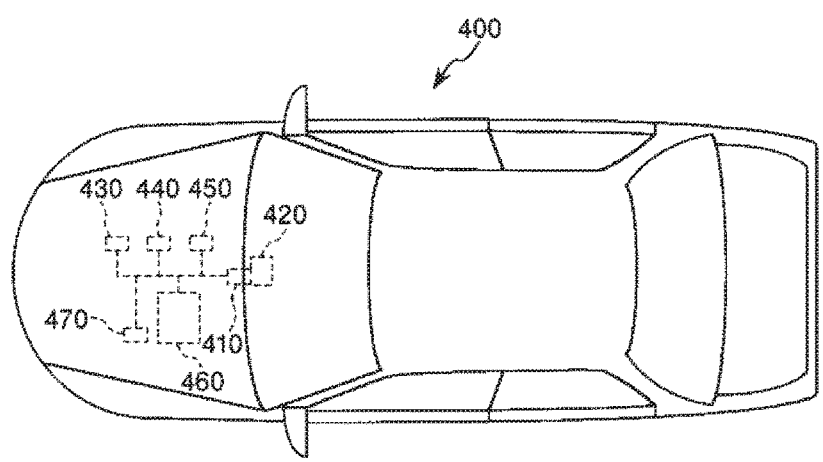
FIG. 8 is a diagram illustrating an embodiment of a moving object according to the invention.

FIG. 8 is a diagram illustrating the embodiment of the moving object according to the invention.

A moving object 400 illustrated in FIG. 8 includes a reference signal generation device 410, a car navigation device 420, controllers 430, 440, and 450, a battery 460, and a backup battery 470.

The above-described reference signal generation device 1 is applied as the reference signal generation device 410. The reference signal generation device 410 performs the positioning calculation in real-time in the normal positioning mode, and outputs 1 PPS, a clock signal, and NMEA data, for example, when the moving object 400 is moving. For example, when the moving object 400 stops, the reference signal generation device 410 performs the positioning calculation a plurality of times in the normal positioning mode. Then, the reference signal generation device 410 sets the most frequent value or the median value of results obtained by performing the positioning calculation the plurality of times, as the current position information, and outputs 1PPS, a clock signal, and NMEA data in the position fixed mode.

The car navigation device 420 is synchronized with 1 PPS or the clock signal which is output by the reference signal generation device 410, and displays the position or the point of time thereof, or other various types of information about a display by using the NMEA data which is output by the reference signal generation device 410.

The controllers 430, 440, and 450 perform various controls for an engine system, a brake system, a keyless entry system, and the like. The controllers 430, 440, and 450 may perform various controls with synchronization with a clock signal output by the reference signal generation device 410.

The moving object 400 in the embodiment includes the reference signal generation device 410, and thus it is possible to ensure high reliability in the middle of moving and stopping.

Various moving objects are considered as such a moving object 400. Examples of the moving object 400 include an automobile (also including an electric automobile), an aircraft such as a jet aircraft or a helicopter, a watercraft, a rocket, a satellite, and the like.

4. Data Communication Device

Next, an embodiment of a data communication device according to the invention will be described.

Figure 9:
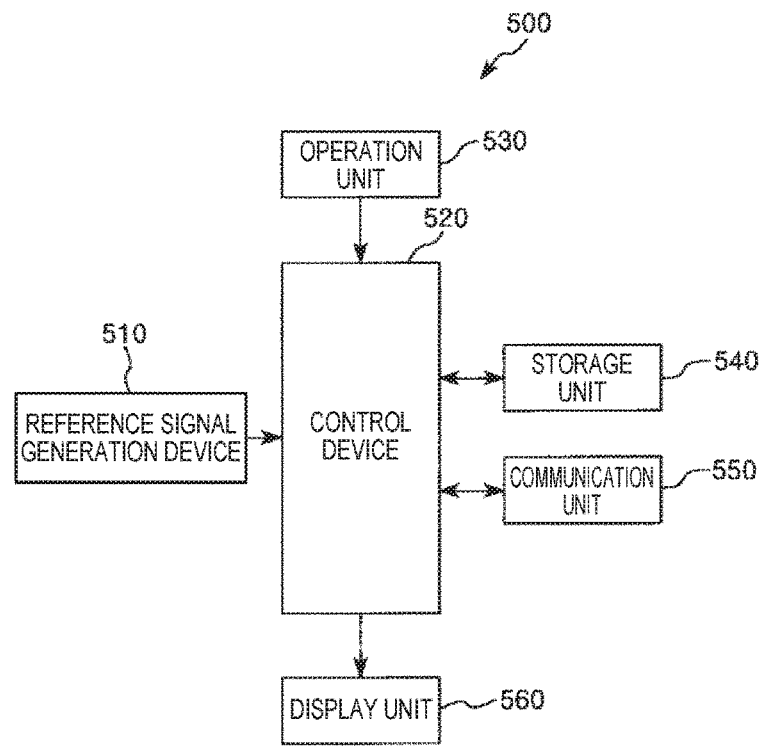
FIG. 9 is a block diagram illustrating an embodiment of a data communication device according to the invention.

FIG. 9 is a block diagram illustrating the embodiment of the data communication device according to the invention.

The data communication device 500 illustrated in FIG. 9 includes a reference signal generation device 510, a control device 520, an operation unit 530, a storage unit 540, a communication unit 550, and a display unit 560. The control device 520 includes a central processing unit (CPU) and the like. The storage unit 540 includes a read only memory (ROM), a random access memory (RAM), or the like.

The above-described reference signal generation device 1 is applied as the reference signal generation device 510. As described before, the reference signal generation device 510 receives a satellite signal, generates a timing signal (1PPS) having high precision, and outputs the generated timing signal outwardly. Thus, it is possible to realize the data communication device 500 with lower cost and high reliability.

Use of the data communication device 500 is not particularly limited. The data communication device 500 is used, for example, in a station that is connected to a communication network and performs terrestrial digital broadcasting and the like.

5. Terrestrial Digital Communication Network

Next, an embodiment of a terrestrial digital communication network according to the invention will be described.

Figure 10:
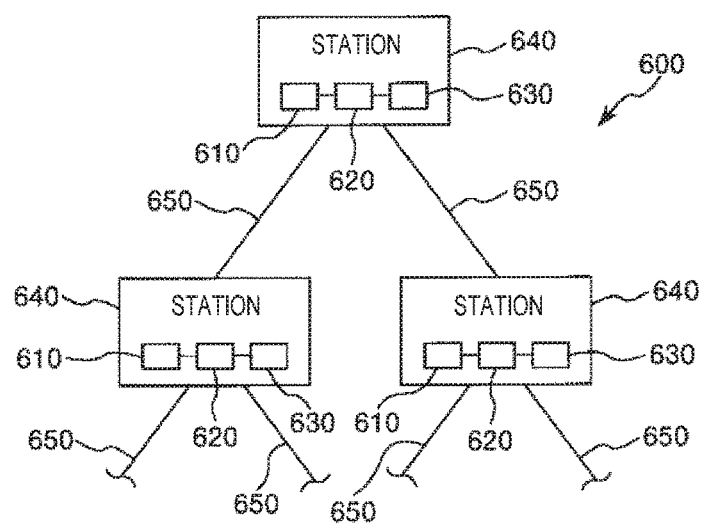
FIG. 10 is a diagram illustrating an embodiment of a terrestrial digital communication network according to the invention.

FIG. 10 is a diagram illustrating the embodiment of the terrestrial digital communication network according to the invention.

The terrestrial digital communication network 600 illustrated in FIG. 10 is a communication network used for connecting a plurality of stations 640 to each other. In each of the plurality of stations 640, a reference signal generation device 610, a control device 620 which includes a central processing unit (CPU) and the like, a communication device 630, and the like are provided. The plural stations 640 are sequentially connected to each other through a transmission path 650. Each of the stations 640 is a station that performs terrestrial digital broadcasting and the like, for example. A communication method between the stations 640 is not particularly limited. For example, a method using an optical signal, in which an optical fiber is used as the transmission path 650 between the stations 640 may be employed or a method using an electrical signal may be employed. In addition, a wireless communication method may be employed.

The above-described reference signal generation device 1 is applied as the reference signal generation device 610. As described before, the reference signal generation device 610 receives a satellite signal, generates a timing signal (1PPS) having high precision, and outputs the generated timing signal outwardly. Thus, it is possible to realize the terrestrial digital communication network 600 with lower cost and high reliability.

Hitherto, the reference signal generation device, the electronic device, the moving object, the data communication device, and the terrestrial digital communication network according to the invention are described based on the embodiment illustrated in the drawings. However, the invention is not limited thereto. A configuration of each of the units may be substituted with any configuration having a similar function. Any other constituents may be added.

In the embodiment, the determination section 72 is configured so as to determine the failure state of the reference signal generation device 1 based on the phase comparison signal of the phase comparator 21, the phase comparison signal of the phase comparator 26, and the sweeping result signal. However, the invention is not limited thereto. For example, the determination section 72 may be configured so as to determine the failure state of the reference signal generation device 1 based on the sweeping result signal and either of the phase comparison signal of the phase comparator 21 and the phase comparison signal of the phase comparator 26.

The reference signal generation device may include a display unit (report unit) that displays (reports) information which is output from the information output unit.

In the embodiment, a reference signal generation device using a GPS is exemplified. However, in the invention, a device used in the reference signal generation device is not limited to the GPS. The reference signal generation device may use a global navigation satellite system (GNSS) except for the GPS, that is, the reference signal generation device may use, for example, Galileo, GLONASS, or the like.

What is claimed is:

1. A reference signal generation device comprising:
   a receiver that is configured to receive a reference signal;
   a first oscillator that includes an atomic oscillator, the first oscillator including a sweeping-result output circuit that is configured to output a sweeping result signal, the sweeping result signal corresponding to a resonance signal obtained by performing frequency sweeping in the first oscillator;
   a first phase comparator that is configured to compare a signal output from the first oscillator and the reference signal in phase so as to output a first phase comparison signal;
   a second oscillator that is configured to generate a signal to be output outwardly;
   a second phase comparator that is configured to compare the signal output from the first oscillator and the signal output from the second oscillator in phase so as to output a second phase comparison signal; and
   a determination circuit that is configured to receive the sweeping result signal, the first phase comparison signal, and the second phase comparison signal,
   wherein
   the determination circuit is configured to determine a failure state of the atomic oscillator based on the sweeping result signal and at least one of the first phase comparison signal and the second phase comparison signal.

2. The reference signal generation device according to claim 1,
   wherein the receiver is configured to receive a satellite signal transmitted from a position information satellite so that the satellite signal is the reference signal.

3. The reference signal generation device according to claim 1,
   wherein the determination circuit includes a failure storage that is configured to store the failure state.

4. The reference signal generation device according to claim 1,
   wherein the sweeping result signal is configured with a plurality of sweeping result signals so that the sweeping-result output circuit is configured to output the plurality of sweeping result signals,
   the determination circuit includes a sweeping-result storage that is configured to store the plurality of sweeping results, and
   the determination circuit is configured to determine the failure state of the atomic oscillator based on a changed quantity of the plurality of sweeping results.

5. The reference signal generation device according to claim 1,
   wherein the determination circuit is configured to determine the failure state based on the first phase comparison signal, the second phase comparison signal, and the sweeping result signal.

6. The reference signal generation device according to claim 1, further comprising:
   an information signal output that is configured to output an information signal including predetermined information, based on a determination result of the determination circuit.

7. A terrestrial digital communication network system comprising:
   first station including:
      a first reference signal generation device; and
      a first communicator that is configured to send and receive data; and
   a second station including:
      a second reference signal generation device; and
      a second communicator that is configured to send and receive data,
   wherein the first station and the second station are communicably connected to each other via the first and second communicators, and
   the first reference signal generation device and the second reference signal generation device both comprise the reference signal generation device according to claim 1.

8. A terrestrial digital communication network system comprising:
   a first station including:
      a first reference signal generation device: and
      a first communicator that is configured to send and receive data; and
   a second station including:
      a second reference signal generation device; and
      a second communicator that is configured to send and receive data,
   wherein the first station and the second station are communicably connected to each other via the first and second communicators, and
   the first reference signal generation device and the second reference signal generation device both comprise the reference signal generation device according to claim 2.

9. A terrestrial digital communication network system comprising:
   a first station including:
      a first reference signal generation device; and
      a first communicator that is configured to send and receive data; and
   a second station including:
      a second reference signal generation device; and
      a second communicator that is configured to send and receive data,
   wherein the first station and the second station are communicably connected to each other via the first and second communicators, and
   the first reference signal generation device and the second reference signal generation device both comprise the reference signal generation device according to claim 3.

* * * * *